United States Patent
Garzon et al.

(10) Patent No.: US 11,698,469 B2
(45) Date of Patent: *Jul. 11, 2023

(54) COLORIMETRIC RADIATION DETECTOR

(71) Applicant: UNM RAINFOREST INNOVATIONS, Albuquerque, NM (US)

(72) Inventors: Fernando Henry Garzon, Santa Fe, NM (US); Kannan Ramaiyan, Albuquerque, NM (US); Kyle Troche, Albuquerque, NM (US); Timothy J. Boyle, Albuquerque, NM (US)

(73) Assignees: UNM RAINFOREST INNOVATIONS, Albuquerque, NM (US); NATIONAL TECHNOLOGY & ENGINEERING SOLUTIONS OF SANDIA, LLC, Albuquerque, NM (US)

(*) Notice: Subject to any disclaimer, the term of this patent is extended or adjusted under 35 U.S.C. 154(b) by 71 days.

This patent is subject to a terminal disclaimer.

(21) Appl. No.: 17/382,140

(22) Filed: Jul. 21, 2021

(65) Prior Publication Data
US 2022/0003884 A1 Jan. 6, 2022

Related U.S. Application Data

(63) Continuation-in-part of application No. 16/785,932, filed on Feb. 10, 2020, now Pat. No. 11,086,028.

(60) Provisional application No. 62/803,880, filed on Feb. 11, 2019.

(51) Int. Cl.
*G01T 1/20* (2006.01)
*G01T 1/04* (2006.01)
*C30B 29/12* (2006.01)
*G01T 1/204* (2006.01)
*G01T 1/202* (2006.01)

(52) U.S. Cl.
CPC ............ *G01T 1/2045* (2013.01); *C30B 29/12* (2013.01); *G01T 1/04* (2013.01); *G01T 1/2023* (2013.01)

(58) Field of Classification Search
CPC .......... G01T 1/02; G01T 1/105; G01T 1/204; G01T 1/2045; G01T 1/2047; C30B 29/12
See application file for complete search history.

(56) References Cited

U.S. PATENT DOCUMENTS 11,086,028 B2 * 8/2021 Boyle ............... G01T 1/105
2017/0023681 A1 1/2017 Patel

OTHER PUBLICATIONS

Han, J-M. et al. "Low Dose Detection of γ Radiation via Solvent Assisted Fluorescence Quenching," J. Am. Chem. Soc. vol. 136, 2014, pp. 5090-5096.

Garg, Shikha et al. "Mechanistic Insights into Free Chlorine and Reactive Oxygen Species Production on Irradiation of Semiconducting Silver Chloride Particles," J. Phys. Chem. C, vol. 118, 2014, pp. 26659-26670.

* cited by examiner

*Primary Examiner* — Mark R Gaworecki
(74) *Attorney, Agent, or Firm* — MH2 Technology Law Group LLP

(57) ABSTRACT

A low cost, rapid, flexible radiation detector uses inorganic metal halide precursors and dyes that respond to self-quenching hybrid scintillation. Remote, high-contrast, laser sensing can be used to determine when exposure of the detector to radiation occurs (even temporally).

19 Claims, 3 Drawing Sheets

COLORIMETRIC RADIATION DETECTOR

CROSS-REFERENCE TO RELATED APPLICATIONS

This patent application is a continuation-in-part of U.S. application Ser. No. 16/785,932 filed Feb. 10, 2020, entitled "COLORIMETRIC RADIATION DETECTOR." This application also claims priority to U.S. Provisional Patent Application No. 62/803,880, filed Feb. 11, 2019. The Ser. No. 16/785,932 and 62/803,880 applications are hereby incorporated by reference in their entirety.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to radiation detection and, in particular, to a direct-reading colorimetric radiation detector.

BACKGROUND OF THE INVENTION

Current dosimeters (radiographic films, scintillation detectors, ion chambers) suffer many drawbacks: difficulty interpreting signals, high cost, complexity of operation, and, they are often single-point detectors. Colorimetric radiation detectors produce a change in color or absorption when exposed to radiation due to the presence of one or more photochromic dyes in the detector. A leading sensing mechanism is the radiation-induced fluorescence quenching of the organic dye 4,4'-di(1H-phenanthro[9,10-d]imidazol-2-yl)-biphenyl (DPI-BP). See J.-M. Han et al., *J. Am. Chem. Soc.* 136, 5090 (2014). This compound is highly fluorescent in chlorinated solvents (e.g., $CHCl_3$, $CH_2Cl_2$) until exposed to >0.01 Gy gamma-radiation. The radiation stimulus generates free radicals (•H, •Cl) from decomposition of the chlorinated solvent. Some of the in situ generated radicals form HCl molecules which then react with the DPI-BP to generate a salt at the imidazole linkage ($HNC_5H_3N•HCl$) of the DPI-BP complex. The salts favor $\pi$-$\pi$ stacking which leads to molecular aggregation and quenching of the fluorescent activity. While this is an acceptable process, the need for a hazardous Cl-based solvent to quench the fluorescence limits its utility in different surfaces or architectures. Further, these relatively inexpensive materials suffer from poor sensitivity and only function in the liquid state.

SUMMARY OF THE INVENTION

The present invention is directed to a colorimetric (direct reading) radiation detector, comprising a metal halide that decomposes on exposure to radiation and a dye molecule whose fluorescence is self-quenched by reaction with a decomposition product of the metal halide. The metal halide can comprise a high-atomic-number metal halide, such as bismuth chloride. The dye can be any number of quenchable dyes, such as fluorescein. The direct reading detector does not require ex situ heating and reading with a photomultiplier detector, as is required with thermoluminescence devices.

BRIEF DESCRIPTION OF THE DRAWINGS

The detailed description will refer to the following drawings, wherein like elements are referred to by like numbers.

DETAILED DESCRIPTION OF THE INVENTION

The present invention is directed to a radiation-induced fluorescence quenching method and colorimetric radiation detector with enhanced sensitivity/quenching behavior to enable remote detection of radiation. The present invention uses radiation-induced fluorescence quenching of organic chemical fluorophores and chemical-amplification, rather than a photomultiplier tube, for detection. The quenched luminosity can be remotely detected using commercial laser probes due to the high-contrast change upon exposure. When used for radiation detection, the technology can remotely monitor low doses of radiation that can be easily detected in a passive, continuous (infinite) mode while encompassing a large physical area.

Figure 1:
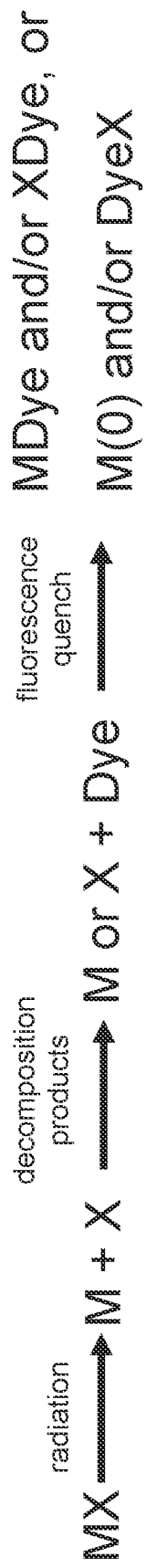
FIG. 1 is an illustration of the radiation-induced fluorescence quenching method of the present invention.

In general, the colorimetric radiation detector of the present invention comprises a metal halide (MX) that decomposes upon exposure to radiation; and a dye whose fluorescence is quenched by a product (M or X) of the metal halide decomposition, as shown in FIG. 1. The metal halide can comprise a high-atomic-number metal, such as a high-atomic-number transition metal or a lanthanide series heavy metal, having adequate stopping power to absorb the incident radiation. Preferably, the metal halide comprises a high-atomic-number post-transition metal, such as bismuth, lead, or tin. The metal halide can comprise a halogen that can easily form a free radical, such as fluorine, chlorine, bromine, or iodine. The metal halide can further comprise an electron-donating co-ligand, such as an alkoxide. The dye can be any number of quenchable dyes, such as fluorescein, coumarin, or rhodamine. The metal halide and dye can be dissolved in a common solvent. The solvent preferably comprises a Lewis basic solvent, such as water or an alcohol, such as methanol, ethanol, or propanol. Alternatively, the solvent can be an aromatic solvent, such as toluene or xylene. The radiation can typically be high-energy ionizing radiation from a ultraviolet (UV), X-ray, gamma-ray, or particle source.

Figure 2:
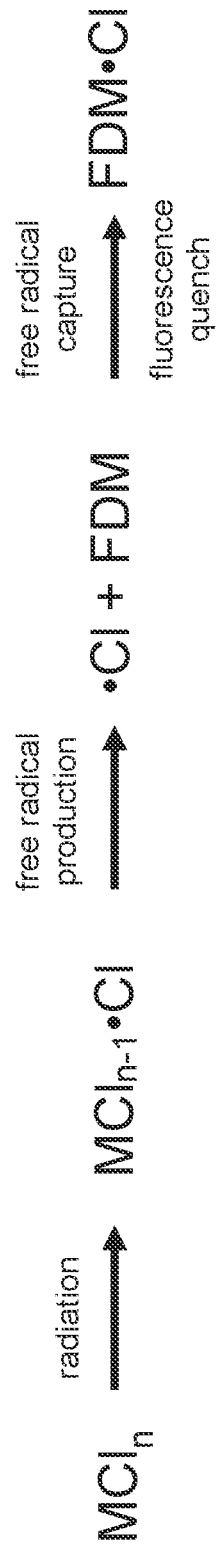
FIG. 2 is an illustration of an exemplary radiation-induced fluorescence quenching system comprising a metal chloride and fluorescein dye molecule that can be used for the remote detection of radiation.

As an example of the invention, the organic chlorinated solvent of the prior system of J.-M. Han et al. can be replaced with an inorganic metal halide, greatly simplifying the system, enhancing its sensitivity, and allowing for more complex geometries to be used as sensors. A possible mechanism of radiation-induced fluorescence quenching of an exemplary metal chloride system is shown in FIG. 2. The exemplary method comprises the efficient radiolysis production of radicals •Cl from a metal chloride $MCl_n$, and the capture of •Cl by dye molecules and subsequent quenching of fluorescent activity. Commercially available metal chlorides ($MCl_n$) and a fluorescein dye molecule (referred to as FDM) can be used. The metal chloride preferably has weak M-Cl bonds that enable the rapid production of •Cl radicals upon exposure to radiation. Homoleptic $MCl_n$ does not necessarily offer the best process for halide formation, therefore an electron-donating co-ligand (i.e., $(OR)_zMCl_{n-z}$) that promote radicalization can be used. Using quantum-based computational modeling as a screening tool, fine tuning of this system can provide the most sensitive radical $MCl_n$ generators and receptive dye molecules possible for a specific radiation source/level.

The formation of •Cl can be generated under similar conditions, but a solid or liquid sensor can be used. This allows for production of more accessible and less obvious sensors (i.e., paint). The use of $MCl_n$ precursors as a source of •Cl is well established with several being stable; however, these typically involve complex ligands bound to the metal. As an example, commercially available $MCl_n$ mixed with FDMs can be as a radiation-induced fluorescence quenching system for remote detection of gamma-radiation. High-atomic-number $MCl_n$ precursors can be used as a source of •Cl in the presence of FDMs. A high number of coordinated Cl can be radicalized, ensuring an economical use of the inorganic precursor. A radiation-induced fluorescence quenching system for remote detection of low levels of gamma or other forms of radiation can thereby be created through computationally refined $MCl_n$/FDM systems, providing enhanced sensitivity coupled with an extremely versatile material form enabling significant improvements in the remote detection of gamma-radiation.

Figure 3A:
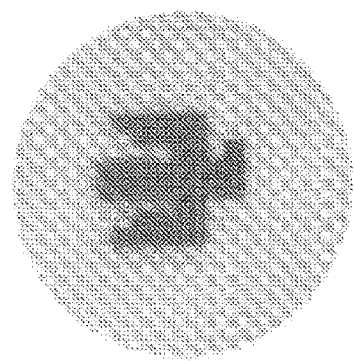
FIG. 3A is a photograph of a filter paper sample impregnated with an aqueous solution of 6-carboxyfluorescein and $BiCl_3$ with a radiation-blocking mask defining a thunderbird image.
Figure 3B:
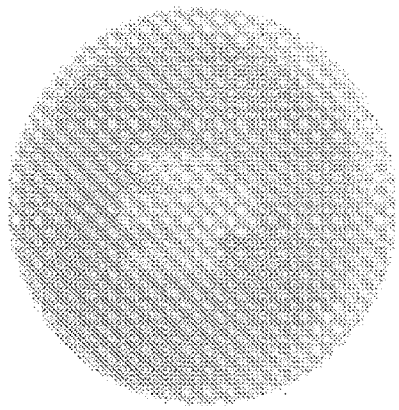
FIG. 3B is a photograph of the image after a 10-minute exposure to UV radiation.
Figure 3C:
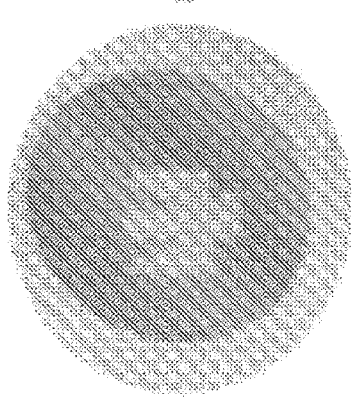
FIG. 3C is a photograph of the image after a one-hour exposure to UV radiation.

As an example of the invention, the colorimetric radiation detector can comprise bismuth chloride, which is soluble in water or methanol and easily forms a chloride radical upon excitation by a radiation source, and a fluorescein dye. A photographic image of a colorimetric radiation detector showing a change in color of the sensor material after exposure to ultraviolet radiation is shown in FIGS. 3A-3B. A 10 weight % aqueous solution of 6-carboxyfluorescein (6CF) was added to 0.1 molar solution of $BiCl_3$, either aqueous or methanol. The mixture was deposited onto Whatman filter paper. FIG. 3A is a photograph showing a sample of paper impregnated with the $6CF/BiCl_3$ solution, with a radiation blocking metal mask defining a thunderbird image. FIG. 3B is a photograph of the sample after a ten minute exposure to 395 nm UV ionizing radiation. The mask has been removed to demonstrate color change resulting from the fluorescence quenching of the 6CF dye. FIG. 3C is a photograph of the sample after a one-hour exposure to the UV radiation.

Additional embodiments of the colorimetric radiation detector as described herein, include actinide compounds including actinide halides. Actinides include the chemical elements having atomic numbers from 89 to 103, including actinium, thorium, protactinium, uranium, neptunium, plutonium, americium, curium, berkelium, californium, einsteinium, fermium, mendelevium, nobelium, and lawrencium. Suitable actinide halides include, but are not limited to thorium chloride, uranium chloride, or combinations thereof. Actinide chlorides may be found in co-ligands as previously described within exemplary embodiments of colorimetric radiation detectors. Actinides and halide compounds thereof are particularly suitable for use in colorimetric radiation detectors as described herein due to the higher atomic number and the heaviest stable elements in the periodic table. Another possible mechanism of actinides being particularly suitable for applications relating to colorimetric radiation detectors as described herein may be attributable to the elemental mass attenuation coefficients of the actinides. Actinides possess higher mass attenuation coefficients, $\mu/\rho$, as well as higher mass energy-absorption coefficient, $\mu_{en}/\rho$, as a function of photon energy, as compared to some other transition metals upon exposure to radiation, such as ultraviolet radiation or x-ray radiation. A desired quality of compounds used in embodiments described herein include compounds wherein the minimum photon energy to create a metal and a halide free radical is outside of the visible light range and from about 10 to about 33 electron volts (eVs).

In certain embodiments of a colorimetric radiation detector, the irradiation of certain metal halides as described herein, particularly in the x-ray region, may follow a reaction pathway whereby the absorption of radiation catalyzes or initiates a reaction in the metal halide that results in the formation of nanoparticles corresponding to the metal in the metal halide composition and a free-radical halogen corresponding to the halide in the metal halide composition in the colorimetric radiation detector. This photoelectric absorption reaction may occur when the metal halide or other composition is irradiated by radiation including, but not limited to gamma rays or x-rays, for example. This reaction pathway results in a metal nanoparticle reaction product that is recoverable and detectable. The free radical interaction with the photochromic dye provides a contribution to a colorimetric shift within the colorimetric radiation detector. In addition, the formation of the nanoparticle by this reaction also provides a contribution to a colorimetric shift within the colorimetric radiation detector. Thus, the two distinct components of the aforementioned reaction provide an enhanced colorimetric shift as compared to the solution-based reactions described herein. As an example, bismuth chloride undergoes this reaction as described, resulting in the formation of a bismuth metal nanoparticle and a chlorine free-radical. Actinides, however, may not necessarily undergo such reactions resulting in formation of metal nanoparticles and halogen free radicals.

The present invention has been described as a colorimetric radiation detector. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A colorimetric radiation detector, comprising:
   a metal halide that decomposes to form a metal and a free radical on exposure to x-ray or ultraviolet radiation; and
   a dye whose fluorescence is quenched by a product of the metal halide decomposition.

2. The colorimetric radiation detector of claim 1, wherein the metal halide comprises bismuth chloride.

3. The colorimetric radiation detector of claim 1, wherein the metal halide comprises an actinide halide.

4. The colorimetric radiation detector of claim 3, wherein the actinide halide comprises a thorium halide.

5. The colorimetric radiation detector of claim 3, wherein the actinide halide comprises a uranium halide.

6. The colorimetric radiation detector of claim 3, wherein the actinide halide comprises an actinide chloride.

7. The colorimetric radiation detector of claim 1, wherein the metal halide further comprises a co-ligand.

8. The colorimetric radiation detector of claim 7, wherein the co-ligand comprises an alkoxide.

9. The colorimetric radiation detector of claim 7, wherein the co-ligand comprises a methoxy group.

10. The colorimetric radiation detector of claim 7, wherein the co-ligand is dioxane.

11. The colorimetric radiation detector of claim 1, wherein the dye comprises fluorescein.

12. The colorimetric radiation detector of claim 1, further comprising a solvent and wherein the metal halide and the dye are dissolved in the solvent.

13. The colorimetric radiation detector of claim 12, wherein the solvent comprises a Lewis base solvent.

14. The colorimetric radiation detector of claim 13, wherein the Lewis base solvent comprises water or an alcohol.

15. The colorimetric radiation detector of claim 12, wherein the solvent comprises an organic solvent.

16. The colorimetric radiation detector of claim 15, wherein the organic solvent comprises toluene or xylene.

17. A method for detecting radiation, comprising:
   providing a colorimetric radiation detector, the detector comprising:
      a metal halide that decomposes to form a metal and a free radical on exposure to ultraviolet or x-ray radiation; and
      a dye whose fluorescence is quenched by a product of the metal halide decomposition;
   exposing the colorimetric radiation detector to radiation; and
   detecting a change in color of the colorimetric radiation detector.

18. The method for detecting radiation of claim 17, wherein the metal halide comprises an actinide halide.

19. The method for detecting radiation of claim 17, wherein the metal halide comprises bismuth chloride.

* * * * *